(12) United States Patent
Kawajiri et al.

(10) Patent No.: US 6,587,006 B2
(45) Date of Patent: Jul. 1, 2003

(54) OSCILLATOR CIRCUIT

(75) Inventors: Jun Kawajiri, Kasugai (JP); Yoshihiro Nagaya, Kasugai (JP); Kyuichi Takimoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/106,030

(22) Filed: Mar. 27, 2002

(65) Prior Publication Data

US 2003/0001683 A1 Jan. 2, 2003

(30) Foreign Application Priority Data

Jun. 26, 2001 (JP) ........................................ 2001-193026

(51) Int. Cl.[7] .............................................. H03B 27/00
(52) U.S. Cl. .......................... 331/45; 331/111; 331/143
(58) Field of Search ............................... 331/45, 60, 74, 331/111, 143, 150, 2, 46, 47, 56, 61; 327/131, 135, 137, 132; 323/26; 363/41

(56) References Cited

U.S. PATENT DOCUMENTS 5,668,508 A * 9/1997 Pulvirenti et al. .......... 331/111
6,020,792 A * 2/2000 Nolan et al. ................ 331/111
6,211,746 B1 * 4/2001 Segawa et al. ............. 331/143
6,356,161 B1 * 3/2002 Nolan et al. ................ 331/176

\* cited by examiner

Primary Examiner—Terry D. Cunningham
Assistant Examiner—Long Nguyen
(74) Attorney, Agent, or Firm—Arent Fox Kintner Plotkin & Kahn, PLLC (57) ABSTRACT

An oscillator circuit for efficiently generating a triangular wave signal having multiple phases. The oscillator circuit includes capacitors, each having two terminals and having a voltage between the two terminals. The capacitors include a first capacitor. A plurality of charge/discharge switching circuits are connected to the first capacitor. Each of the charge/discharge switching circuits generates a switching signal for an associated one of the switches to control the charging and discharging of the associated capacitor. The switching signals of the charge/discharge switching circuits have different phases. Each of the charge/discharge switching circuits receives a first capacitor voltage between the terminals of the first capacitor and compares the first capacitor voltage with a first reference voltage and a second reference voltage to generate the switching signal that has a predetermined phase. A triangular wave signal is generated at one of the two terminals of each of the capacitors. The triangular wave signals have different phases.

19 Claims, 5 Drawing Sheets

OSCILLATOR CIRCUIT

BACKGROUND OF THE INVENTION

The present invention relates to an oscillator circuit, and more particularly, to a multiphase triangular wave oscillator circuit used, for example, in a PWM switching regulator.

The increase in the operating speed of recent central processing units (CPUs) has increased the current consumed by a CPU. A switching regulator, which supplies current to the CPU, must have a large current output and high efficiency. The switching regulator goes ON and OFF at a high speed in response to a triangular wave signal, which is generated by a triangular wave oscillator circuit, to generate a pulse signal. Further, the switching regulator smoothens the pulse signal and generates a DC voltage.

To increase the current output from the switching regulator, a plurality of regulators may be connected parallel to one another (i.e., configure multiple channels) so that the output of the regulators (pulse signals) are synthesized. A ripple current, which is produced at the input of the switching regulator, decreases the efficiency of the regulator. It is thus required that multiple channels be configured in the triangular wave oscillator circuit, which generates the triangular wave, to prevent the efficiency from decreasing.

Figure 1:
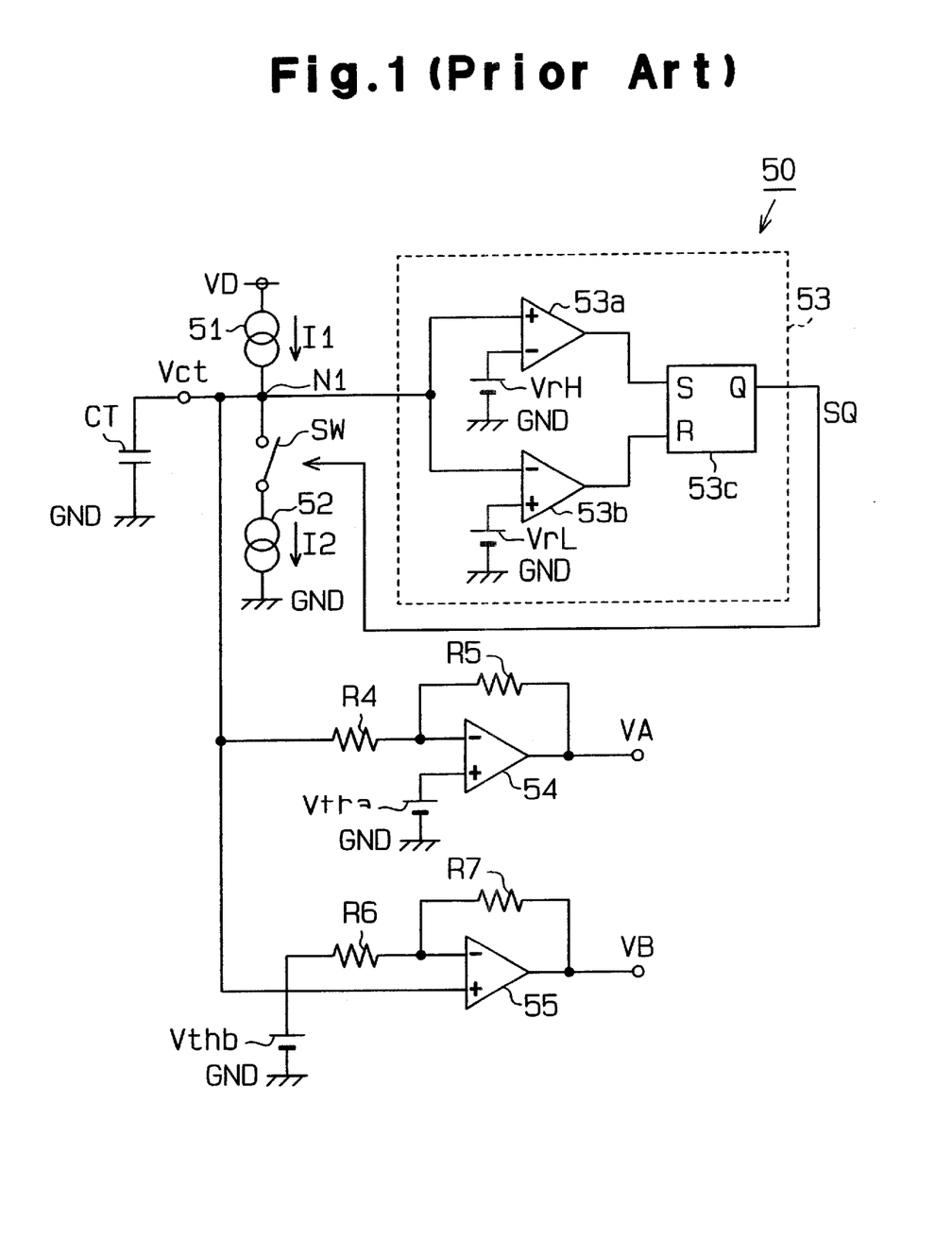
FIG. 1 is a schematic circuit diagram of a prior art triangular wave oscillator circuit.

FIG. 1 is a schematic circuit diagram of a prior art triangular wave oscillator circuit 50. The oscillator circuit 50 includes a first current source 51, a second current source 52, a charge/discharge switching circuit 53, a capacitor CT, a switch SW, a first op amp 54, and a second op amp 55.

A first current I1 flows from the first current source 51 in accordance with the power supplied from a power supply VD. The first current source 51 is connected to the ground GND via the capacitor CT and connected to the second current source 52 via a switch SW. The second current source 52 is connected to the ground GND. A second current I2 flows from the second current source 52 in accordance with the power supplied from the power supply VD. The drive current value of the second current source 52 is two times greater than that of the first current source 51.

The charge/discharge switching circuit 53 includes a first comparator 53a, a second comparator 53b, and a flip-flop 53c. The charge/discharge switching circuit 53 opens and closes the switch SW in accordance with a voltage Vn1 at a node N1 between the first current source 51 and the capacitor CT to generate a switching signal, which opens and closes the switch SW.

The first comparator 53a has a non-inverting input terminal supplied with the node voltage Vn1 and an inverting input terminal supplied with a first reference voltage VrH. The first comparator 53a generates a first comparator signal at a high level when the node voltage Vn1 becomes greater than or equal to the first reference voltage VrH.

The second comparator 53b has an inverting input terminal supplied with the node voltage Vn1 and a non-inverting input terminal supplied with a second reference voltage VrL. The second comparator 53b generates a second comparator signal at a high level when the node voltage Vn1 becomes less than or equal to the second reference voltage VrH.

The flip-flop 53c has a set signal input terminal S, which receives the first comparator signal, and a reset signal input terminal R, which receives the second comparator signal. When the first comparator signal is high, the flip-flop 53c generates the switching signal SQ so that the switch SW is closed. When the second comparator signal is high, the flip-flop 53c generates the switching signal SQ so that the switch SW is opened.

In the oscillator circuit 50, when the switch SW is opened, the first current I1 charges the capacitance CT and increases the node voltage Vn1. When the node voltage Vn1 becomes greater than or equal to the first reference voltage VrH, the first comparator signal of the first comparator 53a goes high. In response to the high first comparator signal, the flip-flop 53c closes the switch SW.

As a result, the closed switch SW causes the second current I2 to flow from the second current source 52. The current value of the second current I2 is two times greater than that of the first current I1 (I2=2×I1). Accordingly, discharge current (I2–I1) flows from the capacitance CT to the ground GND. This decreases the node voltage Vn1. The drive current value of the second current source 52 is two times greater than that of the first current source 51. Thus, the rate at which the node voltage Vn1 increases is equal to the rate at which the node voltage Vn1 decreases.

When the node voltage Vn1 becomes less than or equal to the second reference voltage VrL, the second comparator signal of the second comparator 53b goes high. The high second comparator signal resets the flip-flop 53c and inverts the switching signal SQ. The inverted switching signal SQ opens the switch SW. As a result, the first current I1 charges the capacitance CT and increases the node voltage Vn1 again.

The oscillator circuit 50 repeats such operation to generate a triangular wave signal Vct, which varies between the first reference voltage VrH and the second reference voltage VrL.

The first op amp (inverting amplification circuit) 54 has an inverting input terminal, which is supplied with the node voltage Vn1 via a resistor R4, and a non-inverting input terminal, which is supplied with a third reference voltage Vtha. The first output signal VA of the first op amp 54 is returned to the inverting input terminal via a resistor R5. The first output signal VA has a voltage obtained by inversely amplifying the node voltage Vn1 in accordance with the third reference voltage Vtha.

The second op amp (non-inverting amplification circuit) 55 has a non-inverting input terminal, which is supplied with the node voltage Vn1, and an inverting input terminal, which is supplied with a fourth reference voltage Vthb via a resistor R6. The second output signal VB of the second op amp 55 is returned to the inverting input terminal via a resistor R7. The second output signal VB has a voltage obtained by amplifying the node voltage Vn1 in accordance with the fourth reference voltage Vthb.

The resistance values of the resistors R4–R7 are set so that the amplifying rates of the first and second op amps 54, 55 are virtually the same. The third and fourth reference voltages Vtha, Vthb are set at a median voltage between the first and second reference voltages VrH, VrL ((VrH+VrL)/2)). Accordingly, the phase of the first output signal VA is the same as that of the triangular wave signal, and the phase of the second output signal VB is opposite to that of the triangular wave signal Vct.

The first and second output signals VA, VB, which have difference phases, alternately activates and inactivates two output transistors. This decreases the ripple current generated at the input of a switching regulator. As a result, the current output of the switching regulator increases, and the efficiency of the switching regulator increases.

To further increase the current output and efficiency of the switching regulator, a triangular wave having three or more phases must be generated. The prior art oscillator circuit 50 can generate two triangular wave signals (first and second output signals VA, VB) having opposite phases. However, the configuration of the oscillator circuit 50 becomes complicated when a triangular wave signal having multiple phases (three or more phases) must be generated. Therefore, the generation of a triangular wave signal having three or more phases is difficult.

SUMMARY OF THE INVENTION

It is an object of the present invention to provide an oscillator circuit that efficiently generates a triangular wave signal having multiple phases.

To achieve the above object, the present invention provides an oscillator circuit including a plurality of capacitors, each having two terminals and having a voltage between the two terminals. The plurality of capacitors includes a first capacitor. The oscillator circuit includes a plurality of first current sources, a plurality of second current sources, and a plurality of switches. Each of the first current sources charges an associated one of the capacitors. Each of the second current sources discharges an associated one of the capacitors. Each of the switches is connected between an associated one of the first current sources and an associated one of the second current sources. A plurality of charge/discharge switching circuits are connected to the first capacitor. Each of the charge/discharge switching circuits generates a switching signal for an associated one of the switches to control the charging and discharging of the associated capacitor. The switching signals of the charge/discharge switching circuits have different phases. Each of the charge/discharge switching circuits receives a first capacitor voltage between the terminals of the first capacitor and compares the first capacitor voltage with a first reference voltage and a second reference voltage to generate the switching signal that has a predetermined phase. A triangular wave signal is generated at one of the two terminals of each of the capacitors. The triangular wave signals have different phases.

A further perspective of the present invention is an oscillator circuit including first, second, and third capacitors, each having two terminals and having a voltage between the two terminals. The oscillator circuit includes a plurality of first current sources, a plurality of second current sources, and a plurality of switches. Each of the first current sources charges an associated one of the capacitors. Each of the second current sources discharges an associated one of the capacitors. Each of the switches is connected between an associated one of the first current sources and an associated one of the second current sources. A first charge/discharge switching circuit is connected to the first capacitor to generate a first switching signal that shifts the first capacitor between a charging state and a discharging state. A second charge/discharge switching circuit is connected to the first and second capacitors to generate a second switching signal that shifts the second capacitor between a charging state and a discharging state. A third charge/discharge switching circuit is connected to the first and third capacitors to generate a third switching signal that shifts the third capacitor between a charging state and a discharging state. The first to third switching signals of the charge/discharge switching circuits have different phases. Each of the first to third charge/discharge switching circuit receives a first capacitor voltage between the terminals of the first capacitor and compares the first capacitor voltage with a first reference voltage and a second reference voltage to generate the corresponding switching signal that has a predetermined phase. A triangular wave signal is generated at one of the two terminals of each of the capacitors. The triangular wave signals have different phases.

A further perspective of the present invention is an oscillator circuit for generating a plurality of triangular shape signals having different phases. The oscillator circuit includes a plurality of capacitors having output nodes, a plurality of first current sources, and a plurality of second current sources. Each of the first current sources charges the corresponding capacitor via a corresponding one of the output nodes. Each of the second current sources has current supply capacity larger than that of each of the first current sources and discharges the corresponding capacitor via a corresponding one of the output nodes. A plurality of switching control circuits are coupled to one of the output nodes in common and generate switching signals having different phases. The oscillator circuit further includes a plurality of switches. Each of the switches is coupled between a corresponding one of the output nodes and a corresponding one of the second current sources. Each switch is controlled in response to a corresponding one of the switching signals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 2:
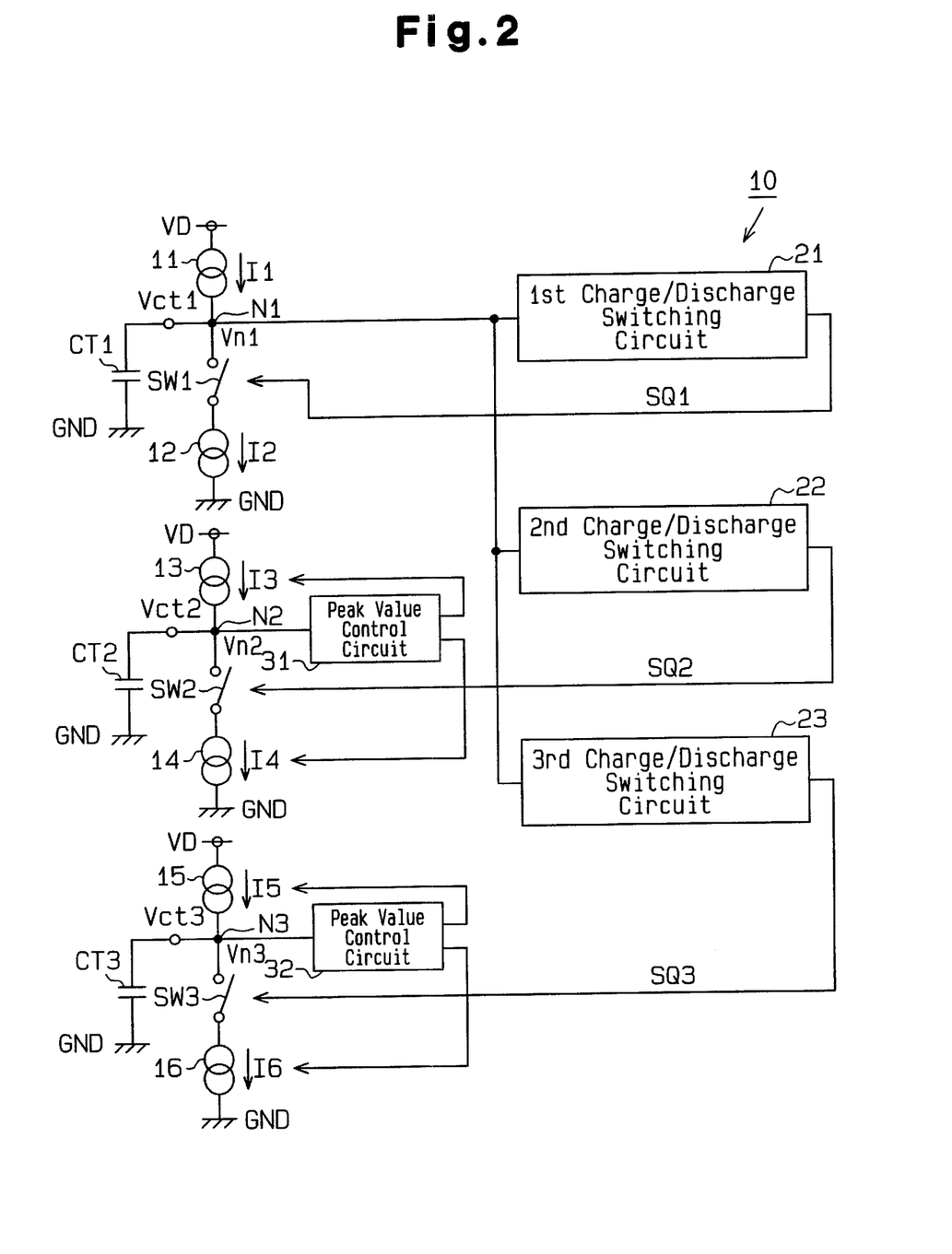
FIG. 2 is a schematic circuit diagram of a triangular oscillator circuit according to a first embodiment of the present invention.

FIG. 2 is a schematic circuit diagram of a triangular wave oscillator circuit 10 according to a preferred embodiment of the present invention. The triangular wave oscillator circuit 10 is incorporated in, for example, a switching regulator.

The triangular wave oscillator circuit 10 includes first to sixth current sources I1–I6, first to third charge/discharge switching circuits 21–23, first to third capacitors CT1–CT3, first to third switches SW1–SW3, and first and second peak value control circuits 31, 32. Each of the switches SW1–SW3 preferably includes an n-channel MOS transistor.

A first current I1 and a second current I2 respectively flow from the first and second current sources 11, 12 in accordance with the power supplied from a power source VD. The drive current value of the second current source 12 is two times greater than that of the first current source 11. The first current source 11 is connected to the ground GND via the first capacitor CT1 and connected to the second current source 12 via the first switch SW1. The second current source 12 is connected to the ground GND.

When the first switch SW1 is opened, the first current I1 charges the first capacitor CT1. This increases a first node voltage (voltage between the terminals of the first capacitor CT1) Vn1, which corresponds to a first capacitor voltage generated between the terminals of the first capacitor. When the first switch SW1 is closed, the second current I2 flows toward the ground GND, and a discharge current (I2–I1) flows from the first capacitance CT1. As a result, the first node voltage Vn1 decreases. The current value of the second current I2 is two times greater than that of the first current I1. Thus, the rate at which the first node voltage Vn1 increases is equal to the rate at which the first node voltage Vn1 decreases.

Third and fourth currents I3, I4 respectively flow from the third and fourth current sources 13, 14 in accordance with the power supplied from the power source VD. The drive current value of the fourth current source 14 is two times greater than that of the third current source 13, and the current value of the fourth current I4 is greater than that of the second current I2 (I3>I1, I4>I2). The third current source 13 is connected to the ground GND via the second capacitor CT2 and connected to the fourth current source 14 via the second switch SW2. The fourth current source 14 is connected to the ground GND.

When the second switch SW2 is opened, the third current I3 charges the second capacitor CT2. This increases a second node voltage (voltage between the terminals of the second capacitor CT2) Vn2. When the second switch SW2 is closed, the fourth current I4 flows toward the ground GND, and a discharge current (I4–I3) flows from the second capacitance CT2. As a result, the second node voltage Vn2 decreases. The current value of the fourth current I4 is two times greater than that of the third current I3. Thus, the rate at which the second node voltage Vn2 increases is equal to the rate at which the second node voltage Vn2 decreases.

Fifth and sixth currents I5, I6 respectively flow from the fifth and sixth current sources 15, 16 in accordance with the power supplied from the power source VD. The drive current value of the sixth current source 16 is two times greater than that of the fifth current source 15, and the current value of the sixth current I6 is greater than that of the second current I2 (I5>I1, I6>I2). The fifth current source 15 is connected to the ground GND via the third capacitor CT3 and connected to the sixth current source 16 via the third switch SW3. The sixth current source 16 is connected to the ground GND.

When the third switch SW3 is opened, the fifth current I5 charges the third capacitor CT3. This increases a third node voltage (voltage between the terminals of the third capacitor CT3) Vn3. When the third switch SW3 is closed, the sixth current I6 flows toward the ground GND, and a discharge current (I6–I5) flows from the third capacitance CT3. As a result, the third node voltage Vn3 decreases. The current value of the sixth current I6 is two times greater than that of the fifth current I5. Thus, the rate at which the third node voltage Vn3 increases is equal to the rate at which the third node voltage Vn3 decreases.

The first to third charge/discharge switching circuits 21–23 are connected to a first node N1. The first to third switching circuits 21–23 respectively generate first to third switching signals SQ1–SQ3 in accordance with the first voltage Vn1. The first to third switching signals SQ1–SQ3 each open and close an associated one of the first to third switches SW1–SW3 to shift an associated capacitor between a charging state and a discharging state.

The first to third switching circuits 21–23 generate the first to third switching signals SQ1–SQ3 so that the predetermined timing (phase) for shifting the associated switches SW1–SW3 between opened and closed states is offset between the switches SQ1–SQ3 by the same phase difference (i.e., the difference between the absolute values of phases being the same). When generating a triangular wave signal having three phases like in the preferred embodiment, the first to third switching signals SQ1–SQ3 offset the switching timing of the switches SW1–SW3 by one third of a cycle.

Figure 3:
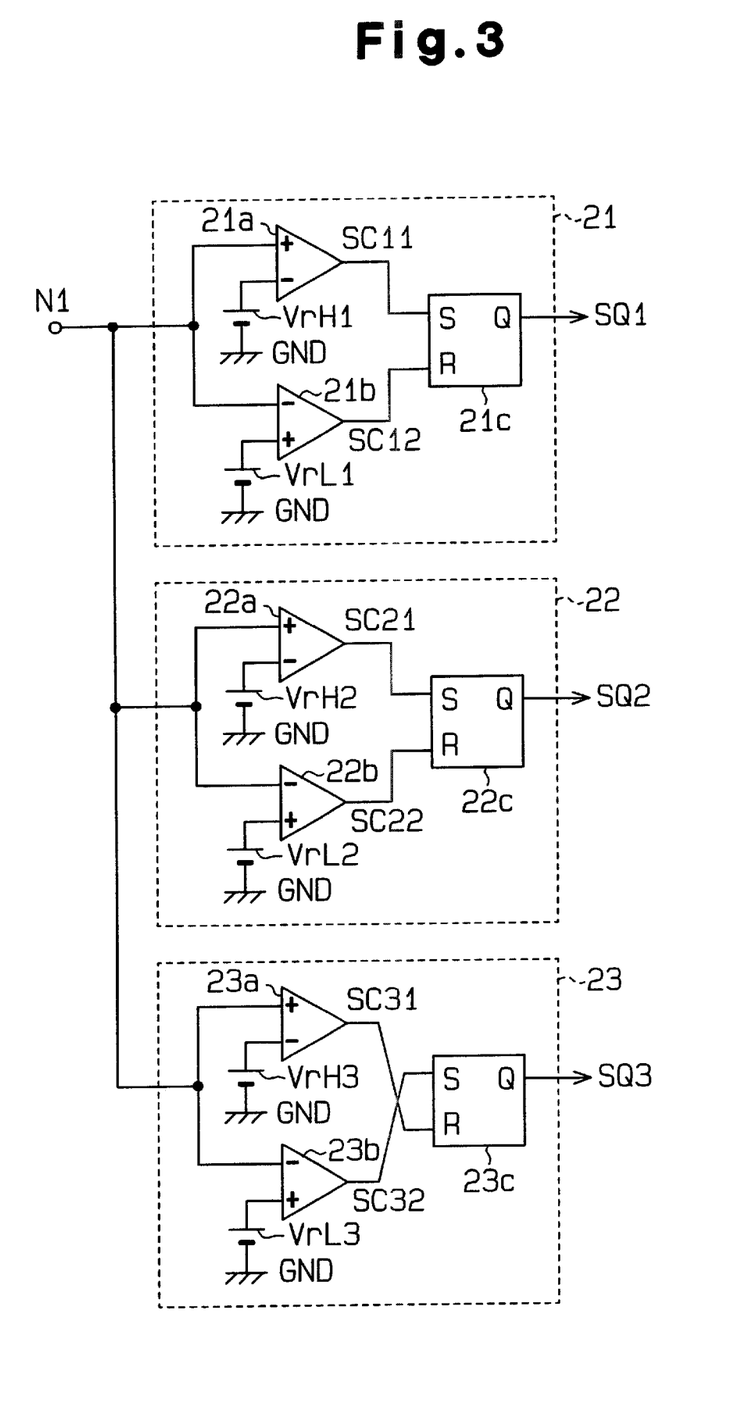
FIG. 3 is a schematic circuit diagram of a charge/discharge switching circuit incorporated in the triangular wave oscillator circuit of FIG. 2.

FIG. 3 is a schematic circuit diagram of the first to third switching circuits 21–23. A first reference voltage VrH1 and a second reference voltage VrL1 are set for the first switching circuit 21. The first switching circuit 21 generates the first switching signal SQ1. When the first node voltage Vn1 becomes greater than or equal to the first reference voltage VrH1, the first switch SW1 closes in accordance with the first switching signal SQ1. When the first node voltage Vn1 becomes less than or equal to the second reference voltage VrL1, the first switch SW1 opens in accordance with the first switching signal SQ1. The opening and closing of the first switch SW1 repeats the charging and discharging of the first capacitance CT1 and generates a first triangular wave signal Vct1, which has the first node voltage Vn1.

A third reference voltage VrH2 and a fourth reference voltage VrL2 are set for the second switching circuit 22. The third and fourth reference voltages VrH2, VrL2 are set using the first and second reference voltages VrH1, VrL1 as follows:

$$VrH2 = VrL1 + (1/3) \times (VrH1 - VrL1)$$

$$VrL2 = VrH1 - (1/3) \times (VrH1 - VrL1)$$

$$= VrL1 + (2/3) \times (VrH1 - VrL1).$$

In the equations, (⅓)×(VrH1−VrL1) represents a divisional voltage, which is obtained by dividing the differential voltage between the first and second reference voltages (VrH1−VrL1) by the number of the phases of the triangular wave signal (3).

The second switching circuit 22 generates the second switching signal SQ2. When the first node voltage Vn1 becomes greater than or equal to the third reference voltage VrH2, the second switch SW2 closes in accordance with the second switching signal SQ2. When the first node voltage Vn1 becomes less than or equal to the fourth reference voltage VrL2, the second switch SW2 opens in accordance with the second switching signal SQ2. The switching phase of the second switch SW2 is delayed from that of the first switch SW1 by one third of a cycle.

The opening and closing of the second switch SW2 repeats the charging and discharging of the second capacitance CT2 and generates a second triangular wave signal Vct2, which has the second node voltage Vn2.

A fifth reference voltage VrH3 and a sixth reference voltage VrL3 are set for the third switching circuit 23. The fifth and sixth reference voltages VrH3, VrL3 are set using the first and second reference voltages VrH1, VrL1 as follows:

$$VrH3 = VrL1 + (2/3) \times (VrH1 - VrL1)$$

$$VrL3 = VrH1 - (2/3) \times (VrH1 - VrL1)$$
$$= VrL1 + (1/3) \times (VrH1 - VrL1).$$

The third switching circuit 23 generates the third switching signal SQ3. When the first node voltage Vn1 becomes greater than or equal to the fifth reference voltage VrH3, the third switch SW3 opens in accordance with the third switching signal SQ3. When the first node voltage Vn1 becomes less than or equal to the sixth reference voltage VrL3, the third switch SW3 closes in accordance with the third switching signal SQ3. The switching phase of the third switch SW3 is delayed from that of the second switch SW2 by one third of a cycle. The opening and closing of the third switch SW3 repeats the charging and discharging of the third capacitance CT3 and generates a third triangular wave signal Vct3, which has the third node voltage Vn3.

The second switching signal SQ2 may be generated so that the switching phase of the second switch SW2 is advanced from that of the first switch SW1 by one third of a cycle, and the third switching signal SQ3 may be generated so that the switching phase of the third switch SW3 is advanced from that of the second switch SW2 by one third of a cycle.

As shown in FIG. 2, the first peak value control circuit 31 is connected to a second node N2, and the second peak value control circuit 32 is connected to a third node N3.

The first peak value control circuit 31 detects the second node voltage Vn2 and controls the current values of the third and fourth currents I3, I4 in accordance with the second node voltage Vn2 so that the maximum and minimum values of the second triangular wave signal Vct2 are substantially the same as those of the first triangular wave signal Vct1.

The second peak value control circuit 32 detects the third node voltage Vn3 and controls the current values of the fifth and sixth currents I5, I6 in accordance with the third node voltage Vn3 so that the maximum and minimum values of the third triangular wave signal Vct3 are substantially the same as those of the first triangular wave signal Vct1.

The oscillator circuit 10 generates the first to third triangular wave signals Vct1–Vct3, which phases are offset from one another by one third of a cycle and which have the same maximum and minimum values.

The first to third switching circuits 21–23 will now be described in detail with reference to FIG. 3. The first switching circuit 21 includes a first comparator 21a, a second comparator 21b, and a first flip-flop 21c.

The first comparator 21a has a non-inverting input terminal, which is supplied with the first node voltage Vn1, and an inverting input terminal, which is supplied with the first reference voltage VrH1. The first comparator 21a generates a first comparator signal SC11 at a high level when the first node voltage Vn1 becomes greater than or equal to the first reference voltage VrH1.

The second comparator 21b has an inverting input terminal, which is supplied with the first node voltage Vn1, and a non-inverting input terminal, which is supplied with the second reference voltage VrL1. The second comparator 21b generates a second comparator signal SC12 at a high level when the first node voltage Vn1 becomes less than or equal to the second reference voltage VrL1.

The first flip-flop 21c has a set signal input terminal S, which receives the first comparator signal SC11, and a reset signal input terminal R, which receives the second comparator signal SC12. When the first comparator signal SC11 becomes high, the first flip-flop 21c causes the first switching signal SQ1 to go high. The first switch SW1 closes in response to the high first switching signal SQ1. When the second comparator signal SC12 becomes high, the first flip-flop 21c causes the first switching signal SQ1 to go low. The first switch SW1 opens in response to the low first switching signal SQ1.

The second switching circuit 22 includes a third comparator 22a, a fourth comparator 22b, and a second flip-flop 22c. The third comparator 22a generates a third comparator signal SC21 at a high level when the first node voltage Vn1 becomes greater than or equal to the third reference voltage VrH2 (VrL1+(⅓)×(VrH1−VrL1)). In response to the third comparator signal SC21 becoming high, the second flip-flop 22c causes the second switching signal SQ2 to go high. The high second switching signal SQ2 closes the second switch SW2.

The fourth comparator 22b generates a fourth comparator signal SC22 at a high level when the first node voltage Vn1 becomes less than or equal to the fourth reference voltage VrL2 (VrH1−(⅓)×(VrH1−VrL1)). In response to the fourth comparator signal SC22 becoming high, the second flip-flop 22c causes the second switching signal SQ2 to go low. The low second switching signal SQ2 opens the second switch SW2.

The third switching circuit 23 includes a fifth comparator 23a, a sixth comparator 23b, and a third flip-flop 23c. The third flip-flop 23c has a set signal input terminal S, which receives a sixth comparator signal SC32 from the sixth comparator 23b, and a reset signal input terminal R, which receives a fifth comparator signal SC31 from the fifth comparator 23a.

The fifth comparator 23a generates the fifth comparator signal SC31 at a high level when the first node voltage Vn1 becomes greater than or equal to the fifth reference voltage VrH3 (VrL1+(⅔)×(VrH1−VrL1)). In response to the fifth comparator signal SC31 becoming high, the third flip-flop 23c causes the third switching signal SQ3 to go low. The low third switching signal SQ3 opens the third switch SW3.

The sixth comparator 23b generates a sixth comparator signal SC32 at a high level when the first node voltage Vn1 becomes less than or equal to the sixth reference voltage VrL3 (VrLH−(⅔)×(VrH1−VrL1)). In response to the sixth comparator signal SC32 becoming high, the third flip-flop 23c causes the third switching signal SQ3 to go high. The high third switching signal SQ3 closes the third switch SW3.

Figure 4:
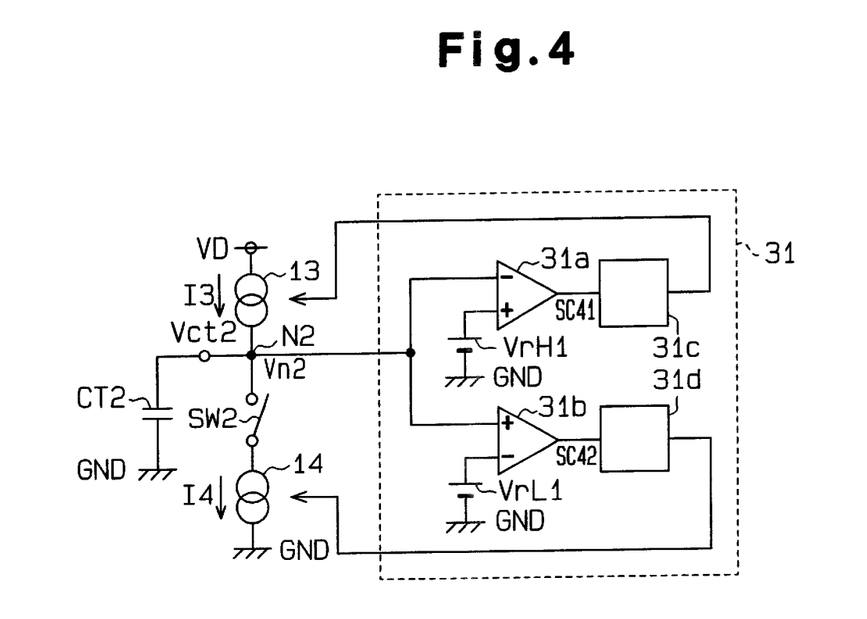
FIG. 4 is a schematic circuit diagram of a peak value control circuit incorporated in the triangular wave oscillator circuit of FIG. 2.

The first and second peak value control circuits 31, 32 will now be described in detail with reference to FIGS. 4 and 5. As shown in FIG. 4, the first peak value control circuit 31 includes a seventh comparator 31a, an eighth comparator 31b, a first current control circuit 31c, and a second current control circuit 31d.

The seventh comparator 31a has an inverting input terminal, which is supplied with the second node voltage Vn2, and a non-inverting input terminal, which is supplied with the first reference voltage VrH1. When the second node voltage Vn2 becomes less than or equal to the first reference voltage VrH1, the seventh comparator 31a generates a seventh comparator signal SC41 at a high level and provides the high seventh comparator signal SC41 to the first current control circuit 31c.

The eighth comparator 31b has a non-inverting input terminal, which is supplied with the second node voltage Vn2, and an inverting input terminal, which is supplied with the second reference voltage VrL1. When the second node voltage Vn2 becomes greater than or equal to the second reference voltage VrL1, the eighth comparator 31b generates an eighth comparator signal SC42 at a high level and provides the high eighth comparator signal SC42 to the second current control circuit 31d.

Figure 5:
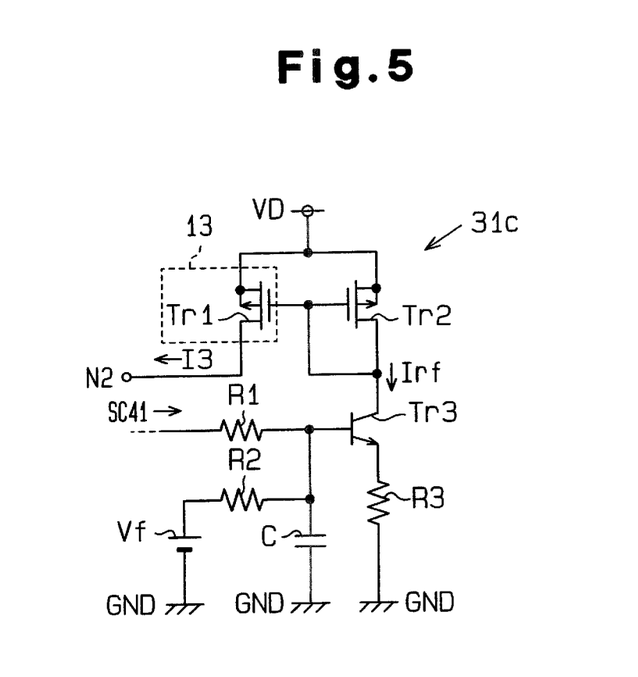
FIG. 5 is a schematic circuit diagram of a current control circuit incorporated in the peak value control circuit of FIG. 4.

FIG. 5 is a circuit diagram showing an example of the third current source 13 and the first current control circuit 31c.

The third current source 13 preferably includes a p-channel MOS transistor, or first transistor Tr1. The first transistor Tr1 is preferably connected to a p-channel MOS transistor, or second transistor Tr2 to form a current mirror. More specifically, the source of the first transistor Tr1 is connected to the power supply VD. The drain of the first transistor Tr1 is connected to the second node N2, and the gate of the first transistor Tr1 is connected to the gate of the second transistor Tr2. The source of the second transistor Tr2 is connected to the power supply VD. The gate and drain of the second transistor Tr2 are connected to each other, and the drain is further connected to a third transistor Tr3.

The third transistor Tr3 is preferably an NPN bipolar transistor. The collector of the third transistor Tr3 is connected to the second transistor Tr2, and the base of the third transistor Tr3 is connected to the output terminal of the seventh comparator 31a (FIG. 4) via a resistor R1. The base of the third transistor Tr3 is connected to the ground via a capacitor C. Further, the base of the third transistor Tr3 is supplied with an initial voltage Vf via a second resistor R2. The emitter of the third transistor tr3 is connected to the ground GND via a third resistor R3.

In the first current control circuit 31c, when the seventh comparator 31a generates the seventh comparator signal SC41 at a high level, the high seventh comparator signal SC41 and the initial voltage Vf charges the capacitor C. When the seventh comparator 31a generates the seventh comparator signal SC41 at a low level, the capacitor C is discharged. A reference current Irf flows to the third transistor in accordance with the charge stored in the capacitor Irf. Further, the third current I3, which is substantially equal to the reference current Irf, flows to the first transistor Tr1 (third current source 13).

When the second node voltage Vn2 is less than the first reference voltage VrH1, the seventh comparator 31a generates the seventh comparator signal SC41 at a high level. When the second node voltage Vn2 is greater than the first reference voltage VrH1, the seventh comparator 31a generates the seventh comparator signal SC41 at a low level. Accordingly, the capacitor C stores charge in correspondence with the first reference voltage VrH1. Thus, the first peak value control circuit 31 substantially equalizes the maximum value of the second triangular wave signal Vct2 with the maximum value of the first triangular wave signal Vct1 (first reference voltage VrH1).

The second current control circuit 31d, the circuit configuration of which is substantially equivalent to that of the first current control circuit 31c, controls the fourth current I4. The second peak value control circuit 32 equalizes the maximum value of the third triangular wave signal Vct3 with the maximum value of the first triangular wave signal Vct1 (first reference voltage VrH1). Further, the second peak value control circuit 32 equalizes the minimum value of the third triangular wave signal Vct3 with the minimum value of the first triangular wave signal Vct1 (second reference voltage VrL1).

Figure 6:
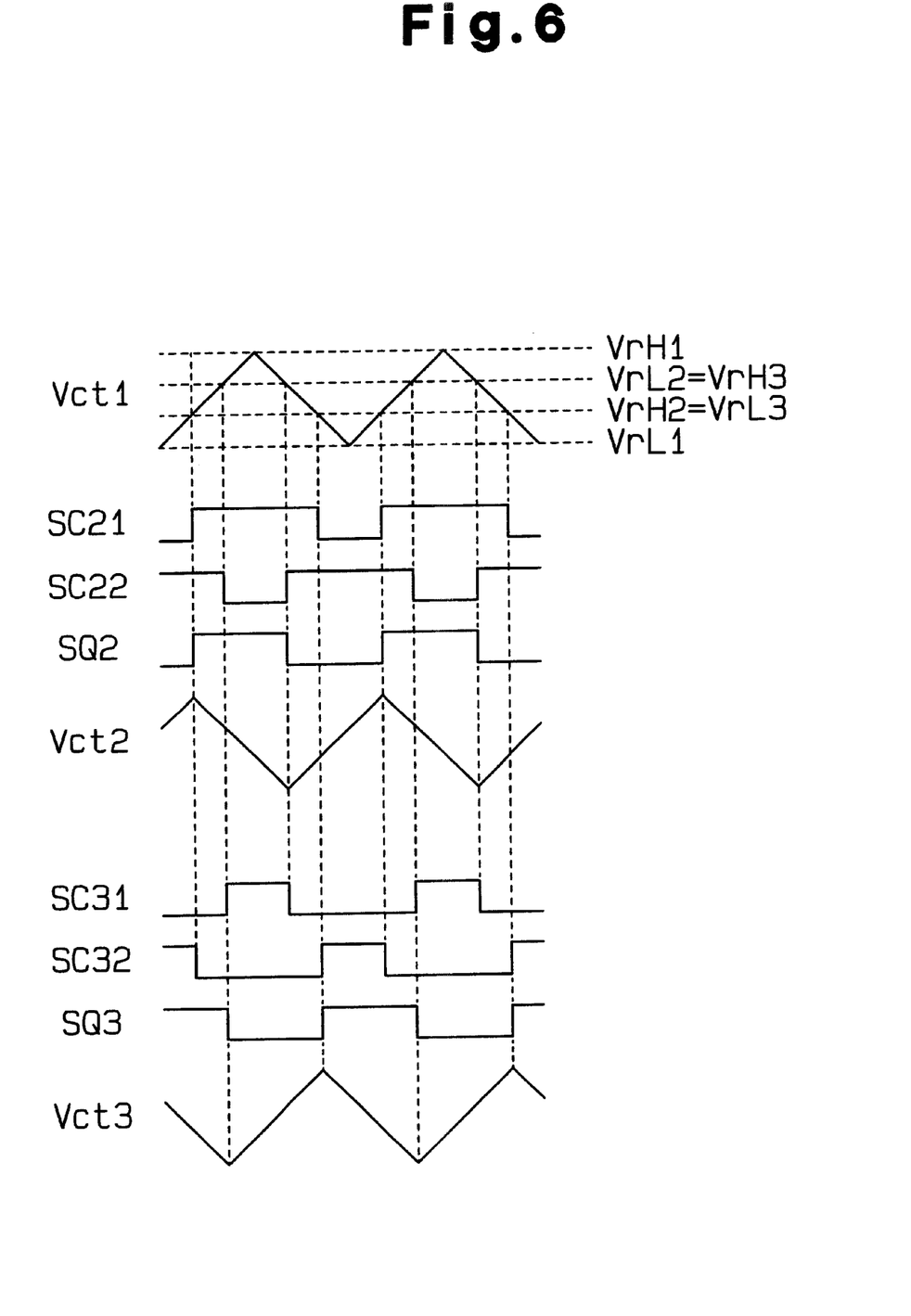
FIG. 6 is a chart illustrating the waveforms of multiple phase triangular signals in the triangular wave oscillator circuit of FIG. 2.

The operation of the oscillator circuit 10 will now be discussed with reference to FIG. 6. The first switching circuit 21 generates the first switching signal SQ1, which opens and closes the first switch SW1. The repetitive opening and closing of the first switch SW1 repeatedly charges and discharges the first capacitor CT1, which, in turn, increases or decreases the first node voltage Vn1. As a result, referring to FIG. 5, the first triangular wave signal Vct1, which oscillates between the first reference voltage VrH1 and the second reference voltage VrL1, is generated at the first node N1.

The third comparator signal SC21 of the second switching circuit 22 goes high when the first node voltage Vn1 becomes greater than or equal to the third reference voltage VrH2. The fourth comparator signal SC22 of the second switching circuit 22 goes high when the first node voltage Vn1 becomes less than or equal to the third reference voltage VrH2. The second switching circuit 22 generates the second switching signal SQ2 in accordance with the third and fourth comparator signals SC21, SC22.

The second switch SW2 opens and closes in accordance with the second switching signal SQ2. The repetitive opening and closing of the second switch SW1 repeatedly charges and discharges the second capacitor CT2, which, in turn, increases or decreases the second node voltage Vn1. As a result, referring to FIG. 6, the second triangular wave signal Vct2, the phase of which is delayed from the phase of the first triangular wave signal Vct1 by one third of a cycle, is generated at the second node N2. The peak value of the second triangular wave signal Vct2 is substantially equal to that of the first triangular wave signal Vct1.

The fifth comparator signal SC31 of the third switching circuit 23 goes high when the first node voltage Vn1 becomes greater than or equal to the fifth reference voltage VrH3. The sixth comparator signal SC32 of the third switching circuit 23 goes high when the first node voltage Vn1 becomes less than or equal to the second reference voltage VrL3. The third switching circuit 23 generates the third switching signal SQ3 in accordance with the fifth and sixth comparator signals SC31, SC32.

The third switch SW3 opens and closes in accordance with the third switching signal SQ3. The repetitive opening and closing of the third switch SW3 repeatedly charges and discharges the third capacitor CT3, which, in turn, increases or decreases the third node voltage Vn3. As a result, referring to FIG. 6, the third triangular wave signal Vct3, the phase of which is delayed from the phase of the second triangular wave signal Vct2 by one third of a cycle, is generated at the third node N3. The peak value of the third triangular wave signal Vct3 is substantially equal to those of the first and second triangular wave signals Vct1, Vct2.

The triangular wave oscillator circuit 10 of the preferred embodiment has the advantages described below.

(1) The oscillator circuit 10 includes the first, second, and third switching circuits 21, 22, 23, which respectively generates the first, second, and third triangular wave signals Vct1, Vct2, Vct3. The first, second, and third triangular wave signals Vct1, Vct2, Vct3, the amplitudes of which are the same, have phases that are offset from one another by one thirds of a cycle. This includes the current output of a switching regulator that incorporates the oscillator circuit 10.

(2) The first and second nodes N2, N3 are connected to the first and second peak value control circuits 31, 32, which detect the voltages of the capacitors CT2, CT3, respectively. Accordingly, the peak values (amplitude) of the second and third triangular wave signals Vct2, Vct3 are equalized with the peak value (amplitude) of the first triangular wave signal Vct1.

(3) The third and fourth reference voltages VrH2, VrL2, which are set by the second switching circuit 22, and the fifth and sixth reference voltages VrH3, VrL3, which are set by the third switching circuit 23, offset the phases of the first to third triangular wave signals Vct1–Vct3 from one another by one thirds of a cycle. Accordingly, in a switching regulator having multiple outputs, ripple current is not produced when outputs (pulse signals) are synthesized, and the efficiency of the regulator is increased.

(4) The first and second peak value control circuits 31, 32 have substantially the same circuit configurations. The first to third charge/discharge switching circuits 21–23 also have substantially the same circuit configurations. This simplifies the oscillator circuit 10. Accordingly, an oscillator circuit that generates four or more triangular wave signals is easily configured.

It should be apparent to those skilled in the art that the present invention may be embodied in many other specific forms without departing from the spirit or scope of the invention. Particularly, it should be understood that the present invention may be embodied in the following forms.

The triangular wave oscillator circuit may generate a triangular wave signal having two phases. In such a case, the first and second reference voltages, which generate the second triangular wave signal, are set so that the phase of the second triangular wave signal is opposite to that of the first triangular wave signal.

The triangular wave oscillator circuit may generate a triangular wave signal having four or more phases, which are offset from one another by the same amount.

In the third switching circuit 23, the set signal input terminal S of the third flip-flop 23c may be provided with the fifth comparator signal SC31 and the reset signal input terminal R may be provided with the sixth comparator signal SC32. In such a case, the configuration of the third switch SW3 may be changed as required if the third switching signal SQ3 is output from the output terminal Q of the third flip-flop 23c. Further, the third switching signal SQ3 may be output from an inverting output terminal Q-bar of the third flip-flop 23c.

The first current control circuit 31c is not limited to the circuit shown in FIG. 5.

The present examples and embodiments are to be considered as illustrative and not restrictive, and the invention is not to be limited to the details given herein, but may be modified within the scope and equivalence of the appended claims.

What is claimed is:

1. An oscillator circuit comprising:
a plurality of capacitors, each having two terminals and having a voltage between the two terminals, wherein the plurality of capacitors includes a first capacitor;
a plurality of first current sources, wherein each of the first current sources charges an associated one of the capacitors;
a plurality of second current sources, wherein each of the second current sources discharges an associated one of the capacitors;
a plurality of switches, wherein each of the switches is connected between an associated one of the first current sources and an associated one of the second current sources; and
a plurality of charge/discharge switching circuits connected to the first capacitor, wherein each of the charge/discharge switching circuits generates a switching signal for an associated one of the switches to control the charging and discharging of the associated capacitor, the switching signals of the charge/discharge switching circuits having different phases;
wherein each of the charge/discharge switching circuits receives a first capacitor voltage between the terminals of the first capacitor and compares the first capacitor voltage with a first reference voltage and a second reference voltage to generate the switching signal that has a predetermined phase, a triangular wave signal is generated at one of the two terminals of each of the capacitors, and wherein the triangular wave signals have different phases.

2. The oscillator circuit according to claim 1, wherein:
each of the charge/discharge switching circuits generates the switching signal for an associated one of the switches at a timing when the first capacitor voltage becomes greater than or equal to the first reference voltage or at a timing when the first capacitor voltage becomes less than or equal to the second reference voltage.

3. The oscillator circuit according to claim 1, wherein:
the plurality of charge/discharge switching circuits includes a first charge/discharge switching circuit for shifting the first capacitor between a charging state and a discharging state; and
the first and second reference voltage of one or more of the charge/discharge switching circuits excluding the first charge/discharge switching circuit are set using the first and second reference voltages of the first charge/discharge switching circuit.

4. The oscillator circuit according to claim 1, wherein:
the plurality of charge/discharge switching circuits includes a first charge/discharge switching circuit for shifting the first capacitor between a charging state and a discharging state; and
the first and second reference voltage of one or more of the charge/discharge switching circuits excluding the first charge/discharge switching circuit are set using a divisional voltage and in accordance with the phase of the generated triangular wave signal of the associated capacitor, the divisional voltage being obtained by dividing a differential voltage between the first and second reference voltages of the first charge/discharge switching circuit by the number of different phases of the triangular wave signals.

5. The oscillator circuit according to claim 1, wherein:
the plurality of charge/discharge switching circuits includes a first charge/discharge switching circuit for shifting the first capacitor between a charging state and a discharging state;
the first reference voltage of one or more of the charge/discharge switching circuits excluding the first charge/discharge switching circuit is set by sequentially adding a divisional voltage to a minimum voltage value of the first capacitor voltage;
the second reference voltage of one or more of the charge/discharge switching circuits excluding the first charge/discharge switching circuit is set by sequentially subtracting the divisional voltage from a maximum voltage value of the first capacitor voltage; and
the divisional voltage is obtained by dividing a differential voltage between the maximum and minimum voltage values of the first capacitor voltage by the number of phases of the triangular wave signals.

6. The oscillator circuit according to claim 1, wherein:
the plurality of charge/discharge switching circuits includes a first charge/discharge switching circuit for shifting the first capacitor between a charging state and a discharging state;

the first reference voltage of one or more of the charge/discharge switching circuits excluding the first charge/discharge switching circuit is set by sequentially subtracting a divisional voltage from a maximum voltage value of the first capacitor voltage;

the second reference voltage of one or more of the charge/discharge switching circuits excluding the first charge/discharge switching circuit is set by sequentially adding the divisional voltage to a minimum voltage value of the first capacitor voltage; and the divisional voltage is obtained by dividing a differential voltage between the maximum and minimum voltage values of the first capacitor voltage by the number of phases of the triangular wave signals.

7. The oscillator circuit according to claim 1, wherein the charge/discharge switching circuits generate the switching signals so that phase differences between the switching signals are equal.

8. The oscillator circuit according to claim 7, wherein each of the charge/discharge switching circuits generates the switching signal in accordance with a comparison of the first capacitor voltage and the first reference voltage and a comparison of the first capacitor voltage and the second reference voltage.

9. The oscillator circuit according to claim 8, wherein:

each of the charge/discharge switching circuits generates the switching signal to open or close the associated switch at a timing when the first capacitor voltage becomes greater than or equal to the first reference voltage or at a timing when the first capacitor voltage becomes less than or equal to the second reference voltage.

10. The oscillator circuit according to claim 1, wherein a first triangular wave signal is generated at one of the two terminals of the first capacitor in accordance with the first capacitor voltage, the oscillator circuit further comprising:

a plurality of peak value control circuits connected to one or more of the capacitors excluding the first capacitor, wherein each of the peak value control circuits controls a charge current and a discharge current of an associated one of the capacitors, each of the peak value control circuits controlling the charge current and the discharge current so that a peak value of the triangular wave signal generated in accordance with the voltage between the terminals of the associated capacitor is substantially equal to a peak value of the first triangular wave signal.

11. The oscillator circuit according to claim 10, wherein the plurality of charge/discharge switching circuits includes a first charge/discharge switching circuit for shifting the first capacitor between a charging state and a discharging state; and wherein each of the peak value control circuits controls the charge current of the associated capacitor so that a maximum voltage value of the triangular wave signal generated in accordance with the voltage between the terminals of the associated capacitor is substantially equal to the first reference voltage set by the first charge/discharge switching circuit and controls the discharge current of the associated capacitor so that a minimum voltage value of the triangular wave signal is substantially equal to the second reference voltage set by the first charge/discharge circuit.

12. The oscillator circuit according to claim 11, wherein each of the peak value control circuit includes:

a first comparator connected to the associated capacitor for receiving the first reference voltage of the first charge/discharge switching circuit;

a second comparator connected to the associated capacitor for receiving the second reference voltage of the first charge/discharge switching circuit;

a first current control circuit connected to the first comparator for controlling the charge current of the associated capacitor when the voltage between the terminals of the associated capacitor is less than or equal to the first reference voltage; and a second current control circuit connected to the second comparator for controlling the discharge current of the associated capacitor when the voltage between the terminals of the associated capacitor is greater than or equal to the second reference voltage.

13. An oscillator circuit comprising:

first, second, and third capacitors, each having two terminals and having a voltage between the two terminals;

a plurality of first current sources, wherein each of the first current sources charges an associated one of the capacitors;

a plurality of second current sources, wherein each of the second current sources discharges an associated one of the capacitors;

a plurality of switches, wherein each of the switches is connected between an associated one of the first current sources and an associated one of the second current sources;

a first charge/discharge switching circuit connected to the first capacitor for generating a first switching signal that shifts the first capacitor between a charging state and a discharging state;

a second charge/discharge switching circuit connected to the first and second capacitors for generating a second switching signal that shifts the second capacitor between a charging state and a discharging state; and a third charge/discharge switching circuit connected to the first and third capacitors for generating a third switching signal that shifts the third capacitor between a charging state and a discharging state, the first to third switching signals of the charge/discharge switching circuits having different phases;

wherein each of the first to third charge/discharge switching circuit receives a first capacitor voltage between the terminals of the first capacitor and compares the first capacitor voltage with a first reference voltage and a second reference voltage to generate the corresponding switching signal that has a predetermined phase, a triangular wave signal is generated at one of the two terminals of each of the capacitors, and wherein the triangular wave signals have different phases.

14. The oscillator circuit according to claim 13, wherein the first to third switching signals have different phases.

15. The oscillator circuit according to claim 14, wherein a difference between the phases of the first and second switching signals, a difference between the phases of the second and third switching signals, and a difference between the phases of the third and first switching signals are substantially the same.

16. An oscillator circuit for generating a plurality of triangular shape signals having different phases, the oscillator circuit comprising:

a plurality of capacitors having output nodes;

a plurality of first current sources, each charging the corresponding capacitor via a corresponding one of the output nodes;

a plurality of second current sources each having current supply capacity larger than that of each of the first current sources, each of the second current sources discharging the corresponding capacitor via a corresponding one of the output nodes;

a plurality of switching control circuits coupled to one of the output nodes in common and generating switching signals having different phases; and a plurality of switches, each coupled between a corresponding one of the output nodes and a corresponding one of the second current sources, wherein each switch is controlled in response to a corresponding one of the switching signals.

17. The oscillator circuit according to claim 16, wherein each of the triangular shape signals is generated at a corresponding one of the output nodes.

18. The oscillator circuit according to claim 16, wherein the switching control circuits generate the switching signals so that phase differences between the switching signals are equal.

19. The oscillator circuit according to claim 16, wherein a first triangular wave signal is generated at a predetermined one of the output nodes, the oscillator circuit further comprising:

a plurality of peak value control circuits connected to one or more of the output nodes excluding the predetermined one of the output nodes, wherein each of the peak value control circuits controls a charge current and a discharge current of an associated one of the capacitors, each of the peak value control circuits controlling the charge current and the discharge current so that a peak value of the triangular wave signal generated at the associated output node is substantially equal to a peak value of the first triangular wave signal.

* * * * *